United States Patent
Pyo

(10) Patent No.: US 6,551,932 B2
(45) Date of Patent: Apr. 22, 2003

(54) METHOD FOR FORMING METAL LINE IN A SEMICONDUCTOR DEVICE

(75) Inventor: Sung Gyu Pyo, Kyonggi-do (KR)

(73) Assignee: Hynix Semiconductor Inc., Kyoungki-do (KR)

(*) Notice: Subject to any disclaimer, the term of this patent is extended or adjusted under 35 U.S.C. 154(b) by 0 days.

(21) Appl. No.: 09/983,668

(22) Filed: Oct. 25, 2001

(65) Prior Publication Data

US 2002/0052110 A1 May 2, 2002

(30) Foreign Application Priority Data

Oct. 26, 2000 (KR) .......................................... 2000-63161

(51) Int. Cl.[7] .............................................. H01L 21/44
(52) U.S. Cl. ........................ 438/687; 438/580; 438/584; 438/616
(58) Field of Search ................................ 438/687, 616, 438/584, 580

(56) References Cited

U.S. PATENT DOCUMENTS

| | | | |
|---|---|---|---|
| 6,110,817 A | * 8/2000 | Tsai et al. ..................... | 438/618 |
| 6,133,144 A | 10/2000 | Tsai et al. ..................... | 438/634 |
| 6,136,708 A | * 10/2000 | Aoki ........................... | 438/687 |
| 6,180,524 B1 | * 1/2001 | Ferrell ......................... | 438/687 |
| 6,211,085 B1 | 4/2001 | Liu ............................. | 438/687 |
| 6,251,759 B1 | * 6/2001 | Guo et al. ..................... | 438/584 |
| 6,251,786 B1 | 6/2001 | Zhou et al. .................... | 438/692 |
| 6,265,319 B1 | 7/2001 | Jang ............................ | 438/723 |
| 6,271,135 B1 | * 8/2001 | Palmans et al. ................. | 438/687 |

FOREIGN PATENT DOCUMENTS

| | | |
|---|---|---|
| EP | 0 989 203 A1 | 3/2000 |
| WO | WO 01/45149 A1 | 6/2001 |

* cited by examiner

*Primary Examiner*—Richard Elms
*Assistant Examiner*—Pho M. Luu
(74) *Attorney, Agent, or Firm*—Finnegan, Henderson, Farabow, Garrett, & Dunner, L.L.P.

(57) ABSTRACT

A method for forming a metal line of a semiconductor device is disclosed, in which a Cu thin film is deposited on a diffusion barrier film after a chemical enhancer and plasma are applied thereon, thereby improving fill characteristics of a contact hole having an ultra-fine structure. The method for forming a metal line in a semiconductor device includes the steps of forming an interlevel insulating film on a semiconductor substrate having a predetermined lower structure, forming a damascene pattern in the interlevel insulating film, forming a diffusion barrier film on a whole structure having the damascene pattern, applying a chemical enhancer on the diffusion barrier film to form a chemical enhancer film on the diffusion barrier film, performing plasma treatment, forming a Cu thin film on the whole structure to fill the damascene pattern, and performing a polishing process to expose an upper surface of the interlevel insulating film so that the Cu thin film only remains within the damascene pattern.

22 Claims, 10 Drawing Sheets

METHOD FOR FORMING METAL LINE IN A SEMICONDUCTOR DEVICE

BACKGROUND OF THE INVENTION

1. Field of the Invention

The present invention relates to a method for forming a metal line in a semiconductor device, and more particularly, to a method for forming a metal line in a semiconductor device in which a copper (Cu) thin film is deposited on a diffusion barrier film after a chemical enhancer and plasma are applied thereon, thereby improving fill characteristics of a contact hole having an ultra-fine structure.

2. Background of the Art

With the trend for high performance in advanced semiconductor devices, the size of a contact hole has been reduced and its aspect ratio has increased. In this respect, excellent step coverage is required and it is necessary to fill the contact hole.

A Cu thin film is mainly used as a metal line material in such advanced semiconductor devices. A method for forming a Cu thin film will briefly be described below. An interlevel insulating film is formed on a semiconductor substrate having a predetermined structure. The interlevel insulating film is patterned by a single damascene process or dual damascene process to form a damascene pattern. A diffusion barrier film is formed on the interlevel insulating film in which the damascene pattern has been formed. The diffusion barrier film, Ta or TaN, can be formed by a physical vapor deposition (PVD) method. Then, Cu thin film is deposited by an electroplating method.

However, the electroplating method fails to deposit the Cu film in a contact hole having an ultra fine structure. Therefore, a method for depositing a Cu thin film by a chemical vapor deposition (CVD) method has been researched. The CVD method still has problems in that it has low deposition rate and high cost. To solve this, a Cu thin film can be deposited by a chemical enhancement CVD (CECVD) method using a chemical enhancer such as iodine.

However, the CECVD method has uneven fill characteristics when filling a contact hole having an ultra fine structure as shown in FIGS. 1 and 2. FIG. 1 shows uneven fill characteristics of a contact hole having an ultra fine structure in which a Cu thin film is deposited by the CECVD method using a chemical enhancer treated for 1 to 30 seconds. FIG. 2 shows an example of a Cu thin film deposited by the CECVD method in which a chemical enhancer is treated for 30 to 100 seconds.

SUMMARY Of THE INVENTION

Accordingly, the present invention is directed to a method for forming a metal line of a semiconductor device that substantially obviates one or more of the problems due to limitations and disadvantages of the related art.

Embodiments consistent with the present invention provide a method for forming a metal line in a semiconductor device in which a contact hole having an ultra fine structure can be uniformly filled.

Embodiments consistent with the present invention also provide a method for forming a metal line in a semiconductor device in which a contact hole having an ultra fine structure can be uniformly filled when Cu is deposited by CECVD method in which a chemical enhancer is treated.

Embodiments consistent with the present invention also a method for forming a metal line in a semiconductor device in which a Cu thin film is deposited by treating with plasma after treating with a chemical enhancer such as iodine, thereby uniformly filling a contact hole having an ultra fine structure.

Additional advantages and features of the embodiments will be set forth in part in the description which follows and in part will become apparent to those having ordinary skill in the art upon examination of the following or may be learned from practice of the invention. Advantages of the invention may be realized and attained as particularly pointed out in the claims.

To achieve these and other advantages and in accordance with the purpose of the present invention, as embodied and broadly described, a method for forming a metal line in a semiconductor device according to an embodiment of the present invention comprises forming an interlevel insulating film on a semiconductor substrate having a predetermined lower structure, forming a damascene pattern in an interlevel insulating film, forming a diffusion barrier film on a whole structure having the damascene pattern, treating with a chemical enhancer the diffusion barrier film to form a chemical enhancer film on the diffusion barrier film, performing a plasma treatment, forming a Cu thin film on the whole structure to fill the damascene pattern, and performing polishing process to expose an upper surface of the interlevel insulating film so that the Cu film remains only within the damascene pattern.

It is to be understood that both the foregoing general description and the following detailed description are exemplary and explanatory and are intended to provide further explanation of the invention as claimed.

BRIEF DESCRIPTION OF THE DRAWINGS

The invention will be described in detail with reference to the following drawings in which like reference numerals refer to like elements wherein.

DETAILED DESCRIPTION OF PREFERRED EMBODIMENTS

Reference will now be made in detail to the preferred embodiments of the present invention, examples of which are illustrated in the accompanying drawings.

FIGS. 3A to 3H are sectional views of a semiconductor device illustrating a method for forming a metal line in a semiconductor device according to an embodiment of the present invention.

Figure 1A:
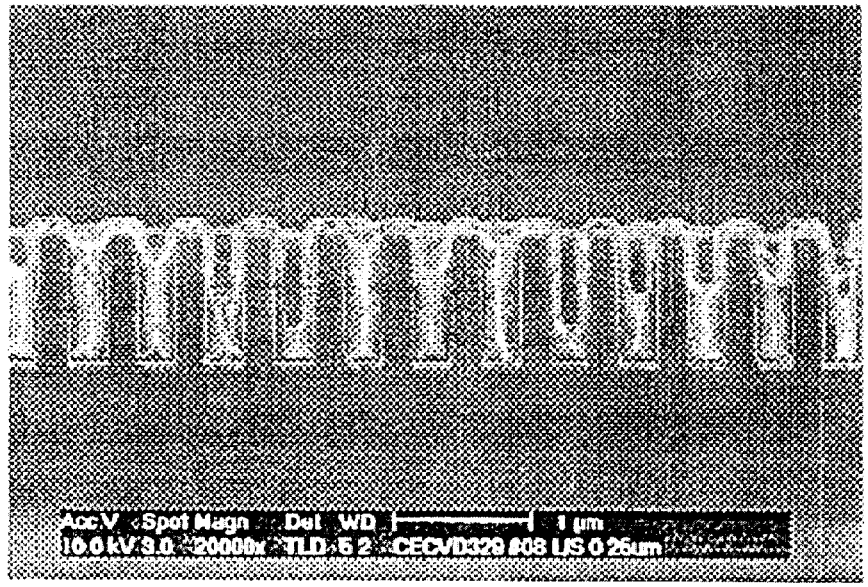
FIGS. 1 and 2 are sectional photographs showing Cu deposited by a CECVD method after treating with a chemical enhancer.
Figure 1B:
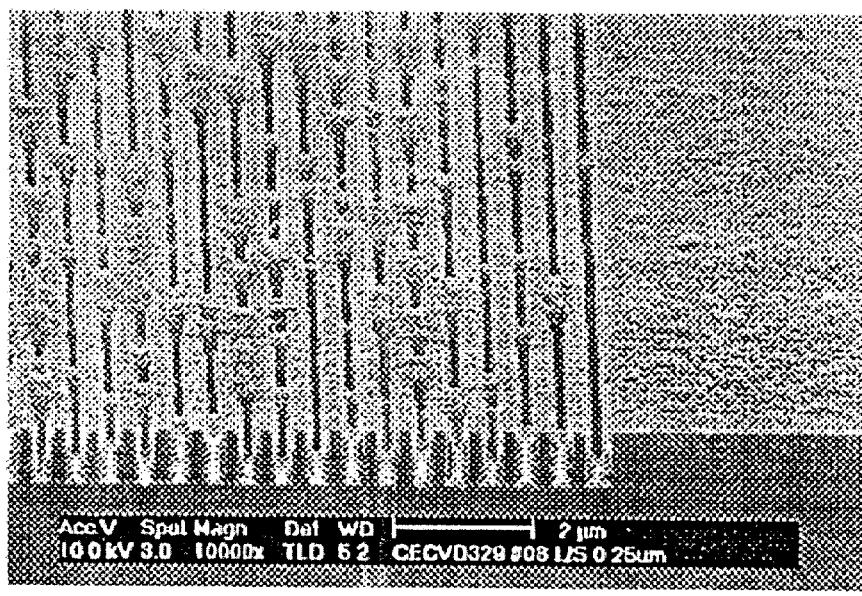
Figure 2A:
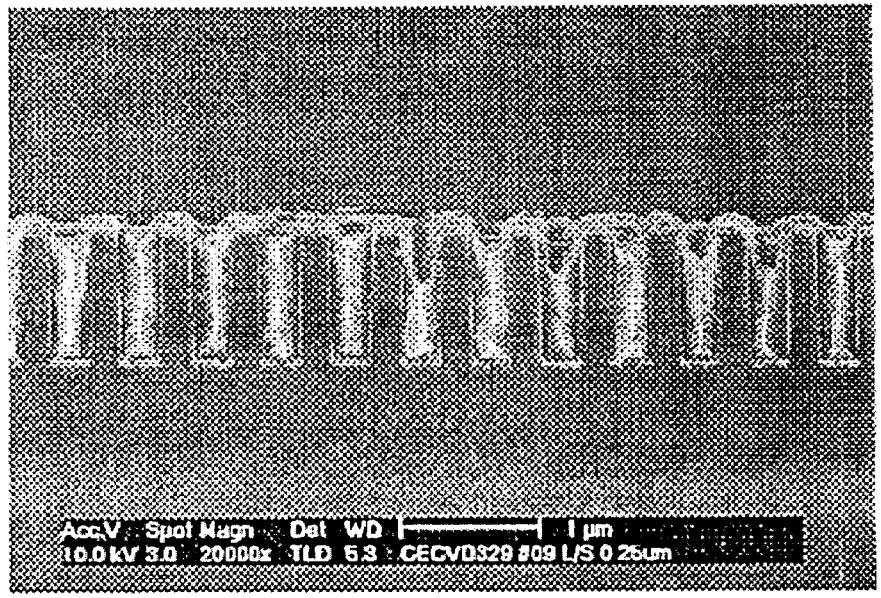
Figure 2B:
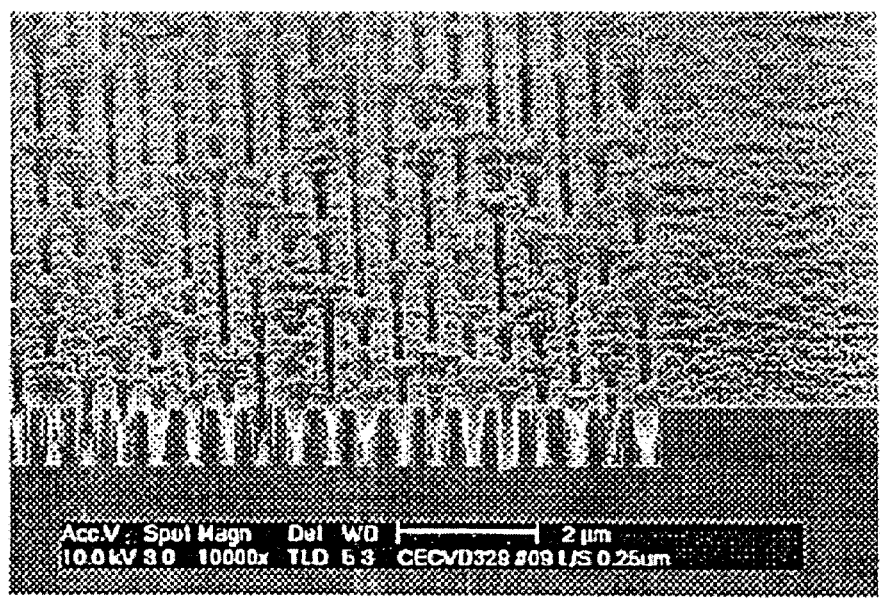
Figure 3A:
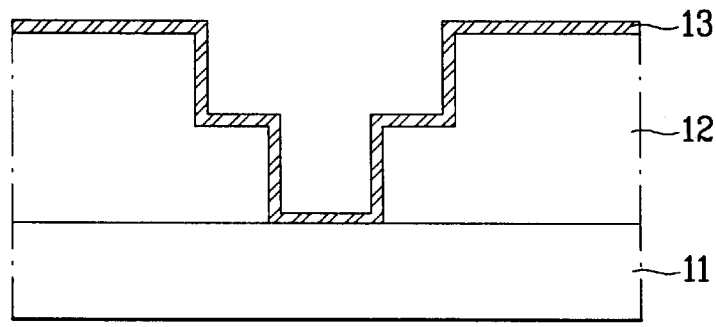
FIGS. 3A to 3H are sectional views of a semiconductor device illustrating a method for forming a metal line in a semiconductor device according to an embodiment of the present invention.
Figure 3B:
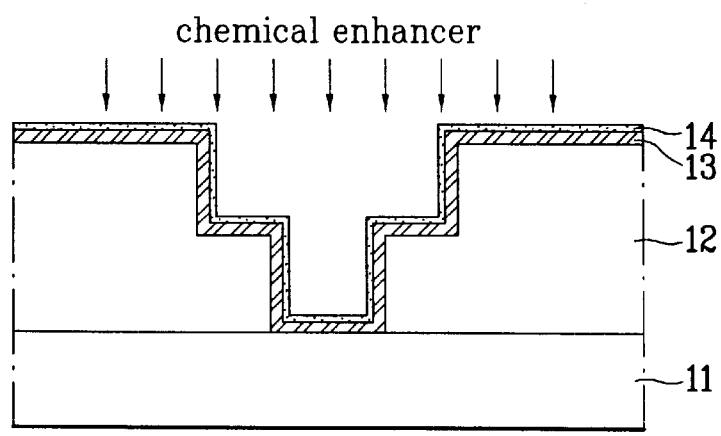
Figure 3C:
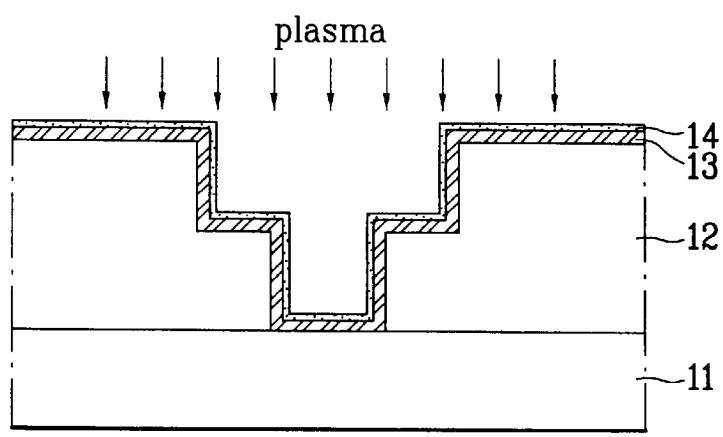
Figure 3D:
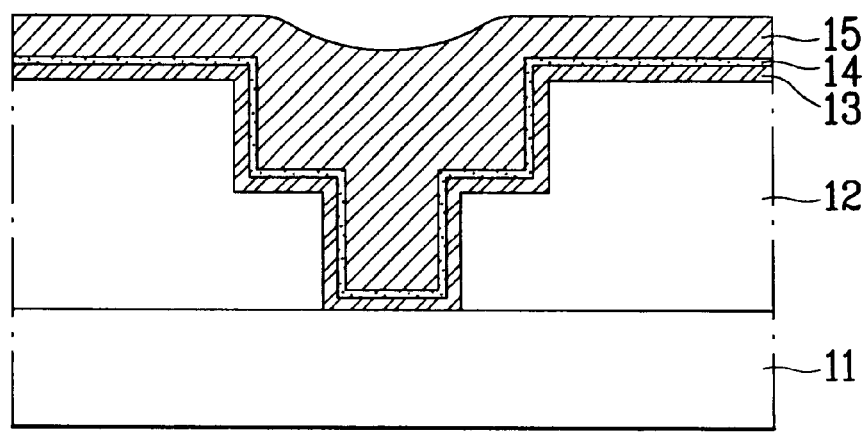

Referring to FIG. 3A, an interlevel insulating film 12 is formed on a semiconductor substrate 11 having a predetermined structure by using an insulating film having low dielectric constant. The predetermined structure of semiconductor substrate 11 can be, for example, a transistor having source and drain electrodes and a gate electrode. Interlevel insulating film 12 is pattered by single damascene process or dual damascene process to form a damascene pattern 20. After a washing process is performed shown is FIGS. 3B and 3C, a diffusion brier film 13 is formed on interlevel insulating film 12 in which damascene pattern 20 is formed as shown in FIG. 3D. The wash process can be performed using radio frequency (RF) plasma when a lower structure is made of Tungsten (W) and Aluminum (Al) as shown in FIG. 3B. Or, a reactive washing process can be performed when a lower structure is made of Cu as shown in FIG. 3C. Also, diffusion barrier film 13 is formed of any one of TiN, Ta, TaN, WN, TiAlN, TiSiN, and TaSiN. The TiN film can be formed by any one of ionized physical vapor deposition (PVD) method, chemical vapor deposition(CVD) method, and metal-organic chemical vapor deposition (MOCVD) method. The Ta film and the TaN film can be formed by ionized PVD method while the WN film is formed by CVD method. The TiAlN film, the TiSiN film, and the TaSiN film can be formed by PVD method or CVD method.

Figure 3E:
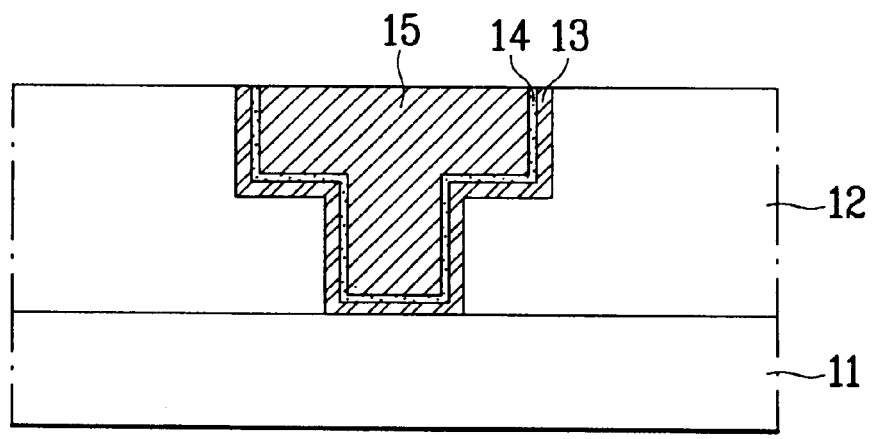
Figure 3F:
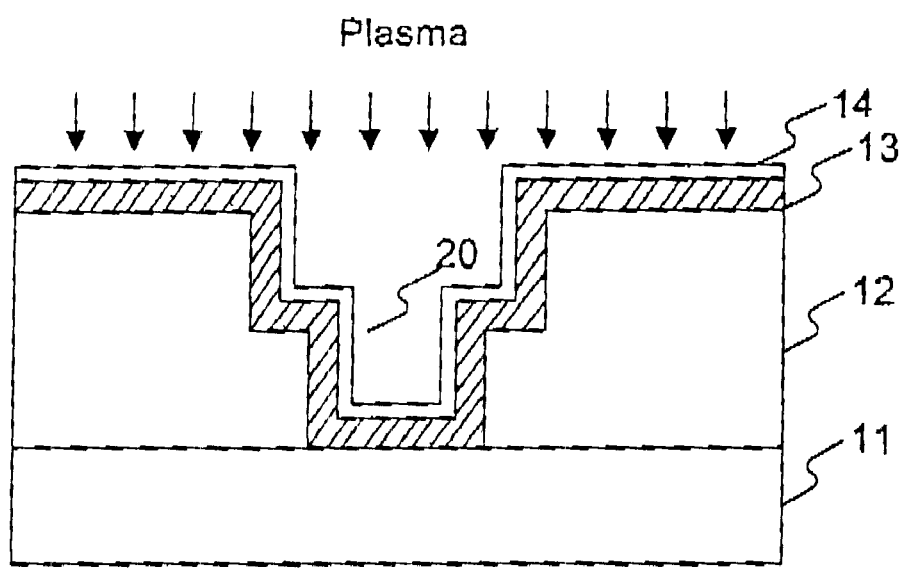

Referring to FIG. 3E, a chemical enhancer such as a catalyst is applied to diffusion barrier film 13 to form a chemical enhancer film 14. A seed layer may be formed or plasma treatment may be performed before the chemical enhancer treatment is performed. The chemical enhancer treatment is performed for between 1 second to 10 minutes at a temperature between −20 and 300° C. using any one of a liquid compound containing iodine, Hydrogen hexafluoroacetonato (Hhfac), Hhfacl/2H$_2$O, trimethylvinylsilane (TMVS), a pure iodine gas, a iodine contained gas, vapor, liquid and gas of F, Cl, Br, I, and Ar, elements corresponding to group seven in the periodic law of the elements, and liquid and gas of their compounds. A wafer (substrate) and a shower head (not shown) are maintained spaced apart from each other at a distance of 5 to 50 mm. Referring to FIG. 3F, after the chemical enhancer treatment is performed, a plasma treatment is performed. Examples of the plasma treatment are dual frequency plasma method, remote plasma method, and plasma etching method. The dual frequency plasma method can be performed for between 1 second to 10 minutes by applying high frequency plasma of 0 to 1000 W and low frequency plasma of 0 to 1000 W at a temperature between −50° C. and 300° C. The remote plasma method can be based on a reactive treatment. The plasma etching method permits single or dual frequency etching. The remote plasma method or the plasma etching method can be performed in one step or multi-steps of 1 to 10 times using either a single gas selected from H, N, Ar, and He or a mixture of H and Ar. In this case, the power of 1 to 1000 W is supplied and treatment time of between 1 second to 10 minutes is required. Also, when the plasma treatment is performed using a single gas selected from H, N, Ar, and He, a flow rate for each gas is in the range of 5 to 1000 sccm. When the plasma treatment is performed using a mixture gas, H of 5 to 95% by concentration and Ar of 5 to 95% by concentration are used. Meanwhile, when the remote plasma method or the plasma etching method is performed by one step, one single gas can be mixed with another single gas.

When the remote plasma or the plasma etching method is performed by multi-steps, a single Ar gas or a mixture gas is used first and then H gas is used. These steps are repeated for 1 to 10 times.

While the plasma treatment is performed, the wafer is maintained at a temperature between 10 and 350° C. and a pressure within a chamber is maintained at 0.3 to 10 Torr.

Figure 3G:
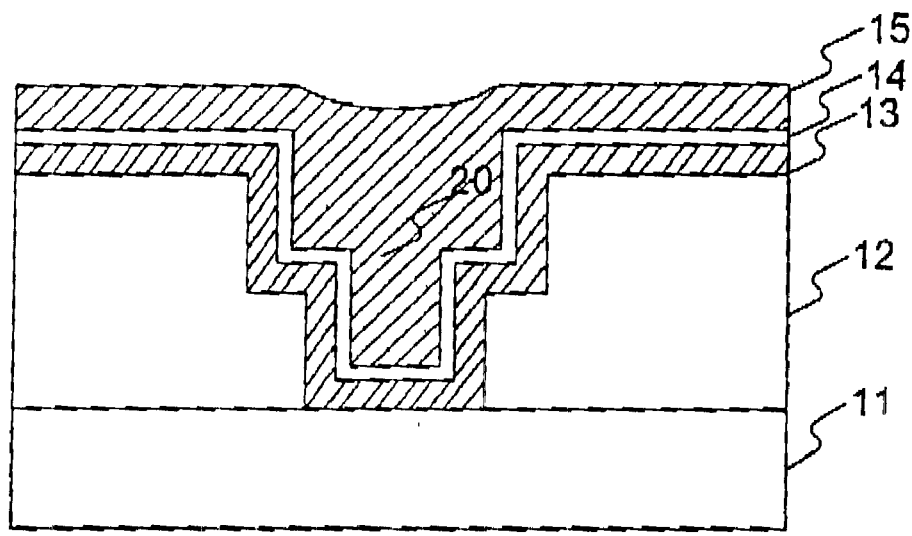

Referring to FIG. 3G, a Cu thin film 15 is formed on a whole structure to fill damascene pattern 20. Hexafluoroacetonato (hfac) based precursors, such as (hfac)Cu(3-Hexyne), (hfac)CuMHY where MHY is 2-methy-1-hexen-3-yne, (hfac)CuDMCOD where DMCOD is dimethycyclooctadiene, and (hfac)CuVTMOS where VTMOS is vinyltri-methoxysilane, (hfac)CuDMB where DMB is 3,3-dimethy-1-butene, and the other Cu based precursors are used as Cu thin film 15. Cu thin film 15 can be deposited by MOCVD method using any one of direct liquid injection (DLI), control evaporation mixer (CEM), orifice, and all spray type evaporators. Instead of using Cu as the material for the thin film, Al or W may be used as the material for the in film. The wafer and the shower head can be spaced apart from each other at the distance of 5 to 50 mm.

Figure 3H:
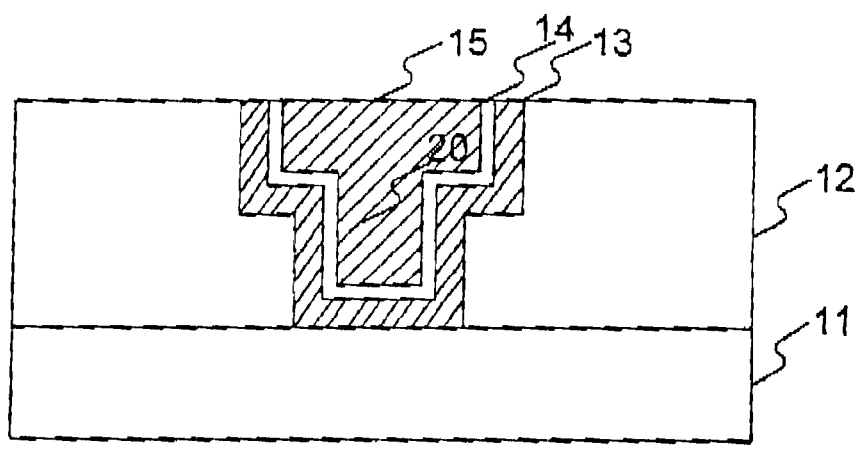

FIG. 3H is a sectional view showing a Cu lime formed by sequentially polishing Cu thin film 15, chemical enhancer film 14 and diffusion barrier film 13. The polishing process can be, for example, a chemical mechanical polishing (CMP) process.

The process for forming diffusion barrier film 13, the process for applying the chemical enhancer, the plasma treatment, and the process for forming Cu thin film 15 may be performed in situ or ex situ.

Figure 4A:
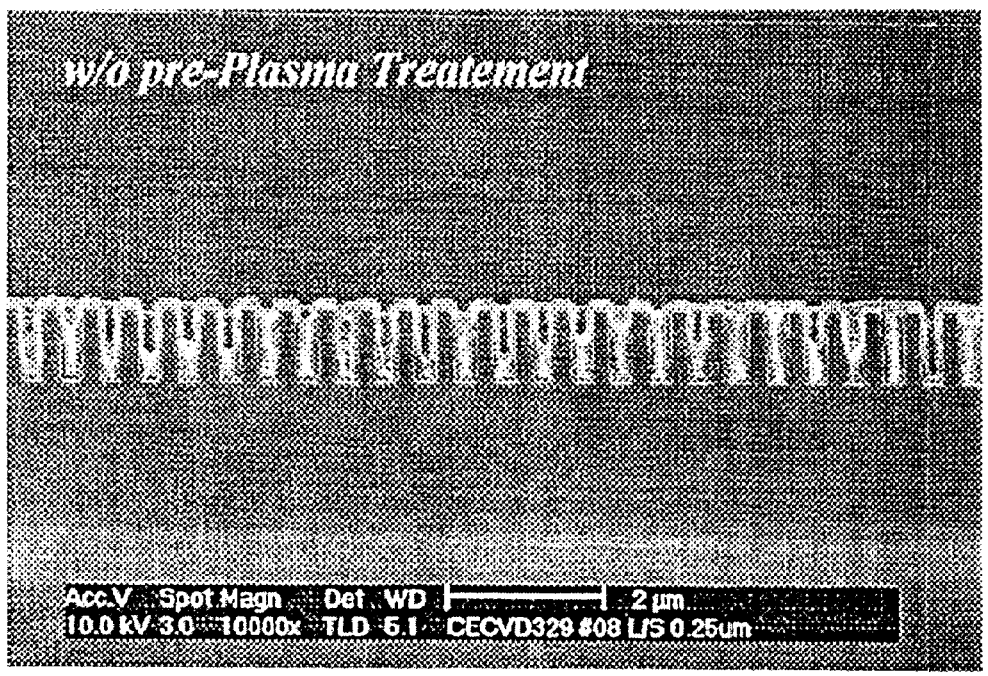
FIGS. 4a and 4b are sectional photographs showing fill characteristics of a contact hole having an ultra fine structure when plasma treatment is not performed and when plasma treatment is performed.
Figure 4A:
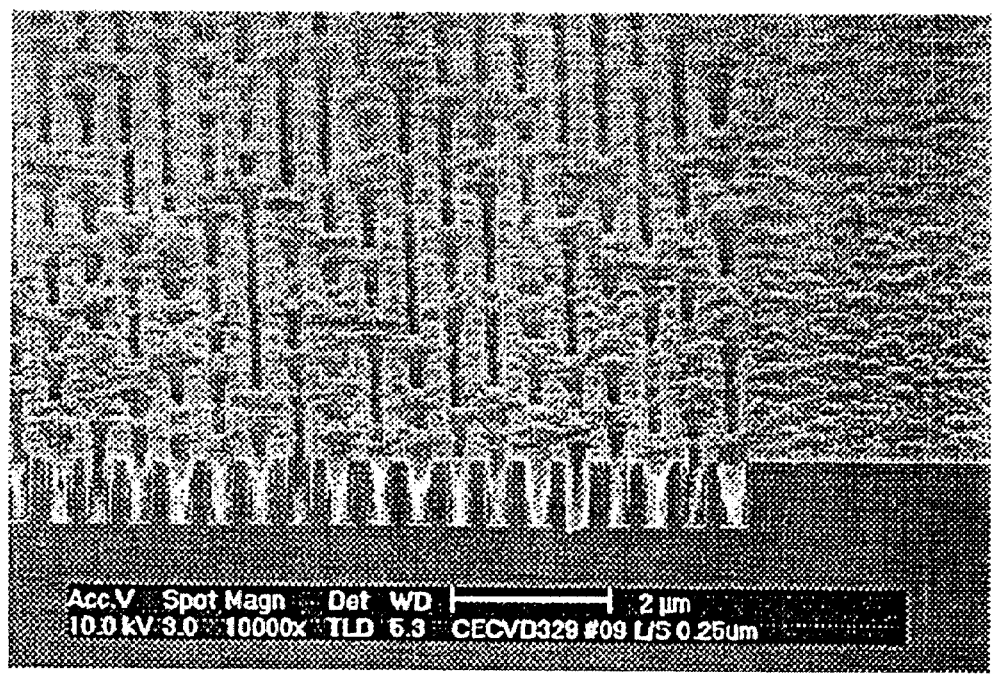
Figure 4B:
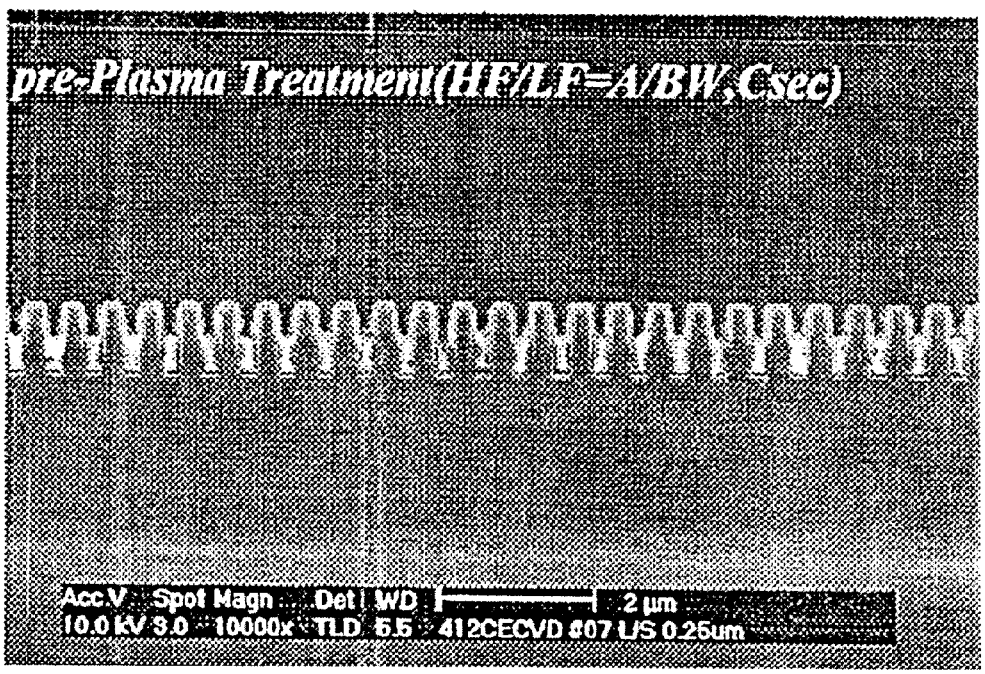
Figure 4B:
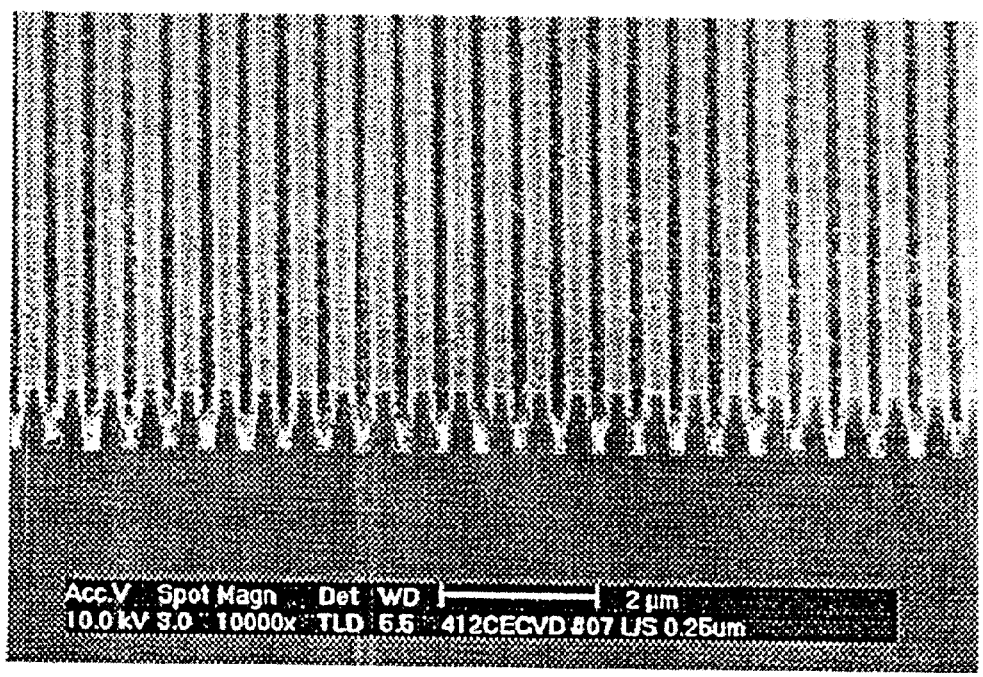

FIGS. 4a and 4b are sectional photographs showing fill characteristics of a contact hole having an ultra fine structure when plasma treatment is not performed and when plasma treatment is performed. The plasma treatment method is performed for between 1 to 100 seconds by applying high frequency plasma of 0 to 1000 W and low frequency plasma of 0 to 1000 W at a temperature between 100° C. and 220° C.

Figure 5A:
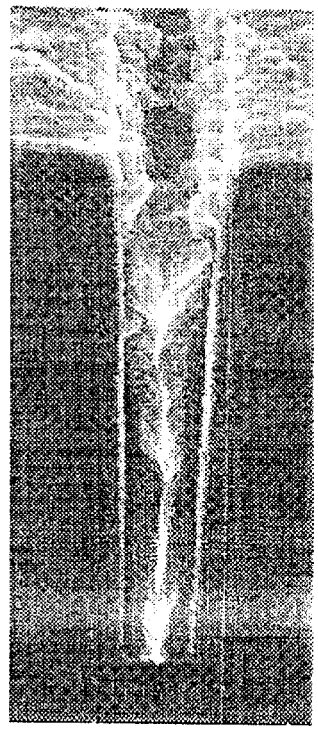
FIGS. 5a and 5b are sectional photographs showing fill characteristics of a contact hole of 0.16 $\mu$m having an aspect ratio of 10:1 when plasma treatment is performed after a chemical enhancer is treated.
Figure 5B:
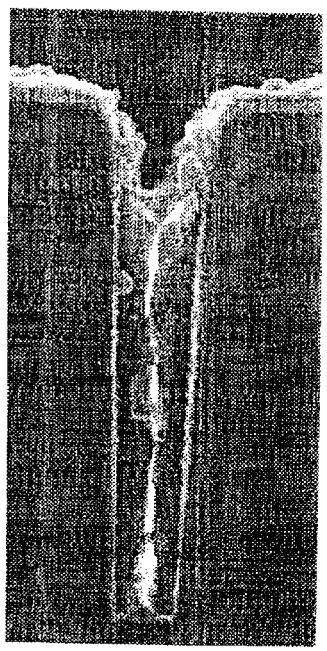

FIGS. 5a and 5b are sectional photographs showing fill characteristics of a contact hole of 0.16 µm having an aspect ratio of 10:1 when the plasma treatment is performed after the chemical enhancer is applied. In this case, a contact hole of 0.1 µm having an aspect ratio of 8:1 can completely be filled.

As aforementioned, the method for forming a metal line of a semiconductor device according to the present invention has the following advantage.

Since the plasma treatment is performed after the chemical enhancer is applied, fill characteristics of the contact hole having an ultra fine structure can be improved, thereby improving reliability of the device.

The foregoing embodiments and advantages are merely exemplary and are not to be construed as limiting the present invention. The present teaching can be readily applied to other types of apparatuses. The description of the present invention is intended to be illustrative, and not to limit the scope of the claims. Many alternatives, modifications and variations will be apparent to those skilled in the art. In the claims, means-plus-function clauses are intended to cover the structures described herein as performing the recited function and not only structural equivalents but also equivalent structures.

What is claimed is:

1. A method for forming a metal line in a semiconductor device comprising the steps of:
   forming an interlevel insulating film on a semiconductor substrate having a predetermined lower structure;
   forming a damascene pattern in the interlevel insulating film;
   forming a diffusion barrier film on a whole structure having the damascene pattern;
   applying a chemical enhancer to the diffusion barrier film to form a chemical enhancer film on the diffusion barrier film;

performing plasma treatment;

forming a Cu thin film on the whole structure to fill the damascene pattern; and performing a polishing process to expose an upper surface of the interlevel insulating film so that the Cu thin film only remains within the damascene pattern.

2. The method of claim 1, further comprising the step of performing a washing process after forming the damascene pattern.

3. The method of claim 2, wherein the washing process is performed using Radio Frequency (RF) plasma when a lower structure is made of W and Al or a reactive washing process is performed when a lower structure is made of Cu.

4. The method of claim 1, wherein the diffusion barrier film is formed by depositing a film selected from a group consisting of a TiN film by any one of ionized physical vapor deposition (PVD) method, chemical vapor deposition (CVD) method, and metal-organic chemical vapor deposition (MOCVD) method, a Ta film by either ionized PVD method or CVD method, a WN film by CVD method, and any one of a TiAlN film a TiSiN film, and a TaSiN film by PVD method or CVD method.

5. The method of claim 1, further comprising the step of performing a plasma treatment before applying the chemical enhancer.

6. The method of claim 1, wherein the chemical enhancer is applied using any one of the following: a liquid compound containing iodine, Hnfacl/2H$_2$O, Hhfac, TMVS, a pure iodine gas, an iodine contained gas, vapor, liquid and gas of F, Cl, Br, I, and Ar corresponding to the group seven elements, and liquid and gas of their compound.

7. The method of claim 1, wherein the chemical enhancer is treated for between 1 second to 10 minutes.

8. The method of claim 1, wherein the chemical enhancer is treated at a temperature between −20 and 300° C.

9. The method of claim 8, wherein the chemical enhancer is treated at a temperature between 100 and 220° C.

10. The method of claim 1 or 5, wherein the plasma treatment is performed using a dual frequency plasma method, remote plasma method, or plasma etching method.

11. The method of claim 10, wherein the dual plasma treatment is performed for between 1 second to 10 minutes by applying high frequency plasma of 0 to 1000 W and low frequency plasma of 0 to 1000 W at a temperature between −50° C. and 300° C.

12. The method of claim 10, wherein the remote plasma method or the plasma etching method is performed using either a single gas selected from a group consisting of H, N, Ar, or He or a mixture of H and Ar.

13. The method of claim 12, wherein the single gas of H, N, Ar, or He has a flow rate of 5 to 1000 sccm.

14. The method of claim 12, wherein the mixture gas includes H of 5 to 95% by concentration and Ar of 5 to 95% by concentration.

15. The method of claim 10, wherein the remote plasma method or the plasma etching method is performed using one step or multi-steps of 1 to 10 times.

16. The method of claim 15, wherein the plasma treatment using one step is performed using a single gas or a mixture gas.

17. The method of claim 15, wherein the plasma treatment using multi-steps is performed by applying H gas after applying Ar single gas or a mixture gas, and is repeated 1 to 10 times.

18. The method of claim 10, wherein the remote plasma method or the plasma etching method is performed for between 1 second to 10 minutes by applying a power of 50 to 700 W.

19. The method of claim 10, wherein the remote plasma method or the plasma etching method is performed such that a wafer is maintained at a temperate between 10° C. and 350° C., the distance between the wafer and a shower head is maintained at 5 to 50 mm, and a pressure within a chamber is maintained at 0.3 to 10 Torr.

20. The method of claim 1, wherein the Cu thin film is formed using any one of (hfac)Cu(3-Hexyne), (hfac)CuMHY, (hfac)CuDMCOD, (hfac)CuVTMOS, (hfac)CuDMB, and (hfac)CuTMVS.

21. The method of claim 1, wherein the Cu thin film is deposited by MOCVD method using one of the following: direct liquid injection (DLI) control evaporation mixer (CEM), orifice, or spray type evaporators.

22. The method of claim 1, wherein an Al or W thin film is formed instead of the Cu thin film.

* * * * *